United States Patent
Desplobain et al.

(10) Patent No.: US 8,470,689 B2
(45) Date of Patent: Jun. 25, 2013

(54) METHOD FOR FORMING A MULTILAYER STRUCTURE

(75) Inventors: Sébastien Desplobain, Le Versoud (FR); Frederic-Xavier Gaillard, Volron (FR); Yves Morand, Grenoble (FR); Fabrice Nemouchi, Molrans (FR)

(73) Assignees: Commissariat a l'Energie Atomique et aux Energies Alternatives, Paris (FR); STMicroelectronics (Crolles 2) SAS, Crolles (FR)

( * ) Notice: Subject to any disclaimer, the term of this patent is extended or adjusted under 35 U.S.C. 154(b) by 67 days.

(21) Appl. No.: 13/293,652

(22) Filed: Nov. 10, 2011

(65) Prior Publication Data

US 2012/0115311 A1 May 10, 2012

(30) Foreign Application Priority Data

Nov. 10, 2010 (FR) .................................. 10 04405

(51) Int. Cl.
*H01L 21/30* (2006.01)
(52) U.S. Cl.
USPC ............ 438/458; 257/E21.287; 257/E21.291; 257/E21.57; 438/455; 438/478; 438/479; 438/508; 438/745

(58) Field of Classification Search
USPC ...... 257/E21.287, E21.291, E21.57; 438/455, 438/458, 478, 479, 508, 745
See application file for complete search history.

(56) References Cited

U.S. PATENT DOCUMENTS

| | | | |
|---|---|---|---|
| 6,037,612 A * | 3/2000 | Nishimura et al. | 257/103 |
| 6,399,410 B1 | 6/2002 | Iwata et al. | |
| 6,828,214 B2 * | 12/2004 | Notsu et al. | 438/455 |
| 7,017,830 B2 * | 3/2006 | Yanagita et al. | 239/101 |
| 7,084,046 B2 * | 8/2006 | Mitani et al. | 438/459 |
| 8,143,514 B2 * | 3/2012 | Chan et al. | 136/256 |
| 2005/0082526 A1 * | 4/2005 | Bedell et al. | 257/52 |
| 2005/0148122 A1 * | 7/2005 | Yonehara | 438/149 |

OTHER PUBLICATIONS

Ernst, T. et al., "Novel 3D integration process for highly scalable Nano-Beam stacked-channels GAA (NBG) FinFETs with HfO$_2$/TiN gate stack," *IEEE*, 2006, pp. 1-4.

Berger, M.G. et al., "Investigation and design of optical properties of porosity superlattices," *Thin Solid Films*, 1995, pp. 313-316, vol. 255.

Kim, S.-H. et al., "The Fabrication of Thin-Film Bulk Acoustic Wave Resonators Employing a ZnO/Si Composite Diaphragm Structure Using Porous Silicon Layer Etching," *IEEE Electron Device Letters*, Mar. 1999, pp. 113-115, vol. 20, No. 3.

* cited by examiner

*Primary Examiner* — Asok K Sarkar
(74) *Attorney, Agent, or Firm* — Oliff & Berridge, PLC

(57) ABSTRACT

The method for forming a multilayer structure on a substrate comprises providing a stack successively comprising an electron hole blocking layer, a first layer made from N-doped semiconductor material having a dopant concentration greater than or equal to $10^{18}$ atoms/cm$^3$ or P-doped semiconductor material, and a second layer made from semiconductor material of different nature. A lateral electric contact pad is made between the first layer and the substrate, and the material of the first layer is subjected to anodic treatment in an electrolyte.

13 Claims, 4 Drawing Sheets

METHOD FOR FORMING A MULTILAYER STRUCTURE

BACKGROUND OF THE INVENTION

The invention relates to a method for forming a multilayer structure on a substrate, and more particularly to a method for forming an alternation of bulk silicon layers and porous silicon layers.

STATE OF THE ART

Substrates comprising an alternation of layers of semiconductor materials enable formation of advanced microelectronic devices. The article "Novel 3D integration process for highly scalable Nano-Beam stacked-channels GAA (NBG) FinFETs with HfO2/TiN gate stack" (Ernst. T et al., Electron Devices Meeting, 2006, IEDM '06. International, pp. 1-4) describes for example formation of a multichannel transistor from a silicon/silicon-germanium multilayer structure.

This structure is obtained by successive epitaxies of silicon (Si) layers and of silicon-germanium (SiGe) layers. When growth of a SiGe layer takes place on a Si layer, the lattice parameter of the silicon-germanium adapts to the lattice parameter of the silicon. The epitaxied silicon-germanium is then pseudomorphic, which enables the crystalline structure to be preserved from one silicon layer to the other.

The SiGe layers are then etched laterally and selectively with respect to the Si layers. This selectivity is obtained by an etch rate of the silicon-germanium that is higher than that of the silicon. The etching method used is etching by carbon tetrafluoride ($CF_4$) plasma.

The cavities created by etching of the SiGe are filled with dielectric material and with polycrystalline silicon in order to form transistor stacked-gates.

This method thus enables superposition of bulk silicon layers having the same crystalline orientation, separated by sacrificial layers of silicon-germanium.

However, the Si/SiGe multilayer structure is unsuitable for formation of several devices, in particular Micro-Electro-Mechanical Systems (MEMS), due to certain dimensional constraints.

Firstly, silicon-germanium etching methods do not allow both a high etch rate and a high selectivity with respect to silicon. This results in over-etching of the silicon layers and/or a limitation on the length of the SiGe layers.

Secondly, the thickness of the SiGe layers is limited, as is the number of periods in the structure. A maximum thickness of the SiGe layers does in fact have to be respected to preserve their pseudomorphic state. This maximum thickness decreases when the germanium concentration increases. It is therefore not possible to increase the germanium concentration to increase the etch rate or selectivity.

SUMMARY OF THE INVENTION

It is observed that a need exists to provide a method for forming a multilayer structure that is suitable for all types of devices.

More particularly, it is desired a multilayer structure comprising a sacrificial material that is able to be eliminated quickly and selectively.

This need tends to be satisfied by providing a stack successively comprising an hole blocking layer, a first layer made from N-doped semiconductor material having a dopant concentration greater than or equal to $10^{18}$ atoms/cm$^3$ or P-doped semiconductor material, and a second layer made from semiconductor material of different nature. A lateral electric contact pad is made between the first layer and the substrate and the material of the first layer is subjected to anodic electrochemical treatment in an electrolyte.

BRIEF DESCRIPTION OF THE DRAWINGS

Other advantages and features will become more clearly apparent from the following description of particular embodiments given for non-restrictive example purposes only and illustrated by means of the appended drawings, in which.

DESCRIPTION OF A PREFERRED EMBODIMENT OF THE INVENTION

It is envisaged to form a multilayer structure comprising at least one bulk silicon layer and one porous silicon layer. Unlike silicon-germanium, porous silicon can be etched quickly and with great selectivity with respect to bulk silicon.

Porous silicon is generally obtained by anodic dissolution, also called anodization, of a sample of bulk silicon in a hydrofluoric acid (HF) based-electrolyte. The silicon sample is placed in an electrochemical bath having a hydrofluoric acid concentration comprised between about 1% and 50%. An electric field is applied by placing a first electrode (cathode) in the electrolyte and a second electrode (anode) in electric contact with the sample. This contact can be direct by applying the electrode on the sample, or indirect, for example via an electrolyte. In certain cases, the sample is exposed to light radiation to enable the dissolution reaction.

Anodization of the silicon results from an equilibrium between mass transport in the electrolyte and transport of charge carriers in the silicon. The dissolution reaction takes place at the surface of the silicon in contact with the electrolyte in the presence of the F$^-$ ions of the HF electrolyte and of holes in the silicon. The electric field enables the holes to be transported to the silicon/electrolyte interface. The density and diameter of the pores vary according to the nature of the sample, in particular its doping type, its doping level, the hydrofluoric acid concentration, the current density and the lighting conditions. The porosity rate varies between 4 and 97%.

A multilayer structure made from porous silicon is described in the article "Investigation and design of optical properties of porosity superlattices" (Berger et al., Thin Solid Films, 255, 1995, pp. 313-316). This structure presents an alternation of porous silicon layers with different pore densities. It is obtained by successive epitaxies of P-doped silicon layers with different dopant concentrations followed by anodization. Such a method does however make the structure completely porous.

The method described in the following also uses anodization to make silicon porous. By contrast, it enables a layer of crystalline bulk silicon to be preserved, which can be used in a microelectronic device. For this, it is made a stack with at least one layer reactive to anodization and one layer resistant to anodization. The reactive layer is then etched laterally, directing the electric field in the plane of the reactive layer.

FIGS. 1 to 4 represent a first series of steps of a preferred embodiment of a method for forming a bulk Si/porous Si multilayer structure.

Figure 1:
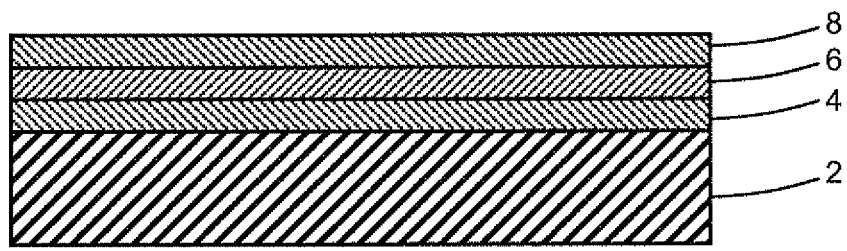
FIGS. 1 to 4 represent a first series of steps of a first embodiment of a method for forming a multilayer structure according to the invention.

FIG. 1 represents a silicon substrate 2, for example a p-doped substrate, on which a stack of layers is formed. The stack comprises a hole blocking layer 4 and two bulk silicon layers 6 and 8. Layers 4, 6 and 8 are preferably formed by epitaxy. The thickness of each of layers 4, 6 and 8 is comprised between 10 nm and several micrometers, preferably between 10 nm and 100 nm.

What is meant by hole blocking layer 4 is a layer limiting transport of holes, and therefore insensitive to anodization. Layer 4 can therefore be made from an electrically insulating material resistant to hydrofluoric acid, an intrinsic semiconductor or an N-doped semiconductor with a dopant concentration of less than $10^{18}$ atoms/cm$^3$. The principle consists in using a layer 4 having a sufficiently low hole concentration to be resistant to anodization.

Layer 4 and layer 8 are preferably made from materials of the same nature, for example an N-doped silicon with a dopant concentration of less than $10^{18}$ atoms/cm$^3$. In the case of an N-type substrate 2, layer 4 can form an integral part of substrate 2.

It is desired that only the silicon of layer 6 be made porous. Layer 6 can then be P-doped, preferably with a dopant concentration (acceptor atoms: boron) greater than $10^{15}$ atoms/cm$^3$. The charge carriers are therefore mainly holes, necessary for the dissolution reaction.

An N-doped layer 6 with a dopant concentration (donor atoms: phosphorus, arsenic) greater than or equal to $10^{18}$ atoms/cm$^3$ can also be used. Strongly N-doped silicon will henceforth refer to N-doped silicon with a concentration greater than or equal to $10^{18}$ atoms/cm$^3$.

The $10^{18}$ atoms/cm$^3$ concentration seems to be a limit concentration between an N-doped silicon susceptible to anodization and an N-doped silicon resistant to anodization. This limit concentration having been determined experimentally, it can vary according to the conditions of implementation, the principle being to use a sufficiently high hole concentration to make a layer sensitive to anodization.

Layer 8 is on the contrary designed to form the bulk silicon layer in the final structure. It is therefore preferably left intact when anodization is performed. The silicon of layer 8 and the silicon of layer 6 are therefore of different natures, considering either the doping (dopants of opposite type or undoped) or the dopant concentration. Layer 8 can be an N-doped silicon layer with a dopant concentration of less than $10^{18}$ atoms/cm$^3$ or an intrinsic silicon.

Figure 2:
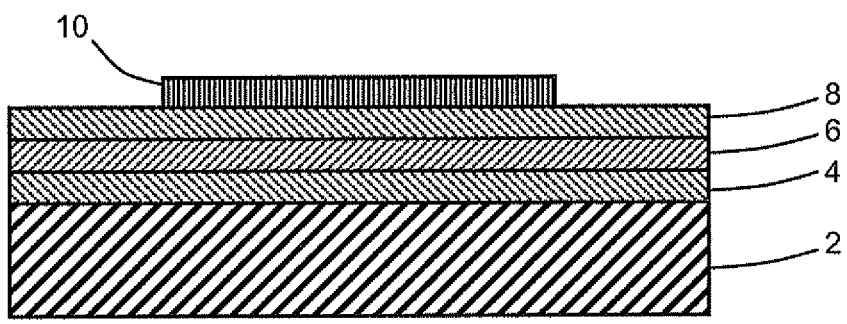

In FIG. 2, an etching mask 10 is placed on layer 8. Mask 10 is preferably made from a material resistant to hydrofluoric acid, for example silicon nitride. Such a mask enables a pattern to be defined in the stack.

Figure 3:
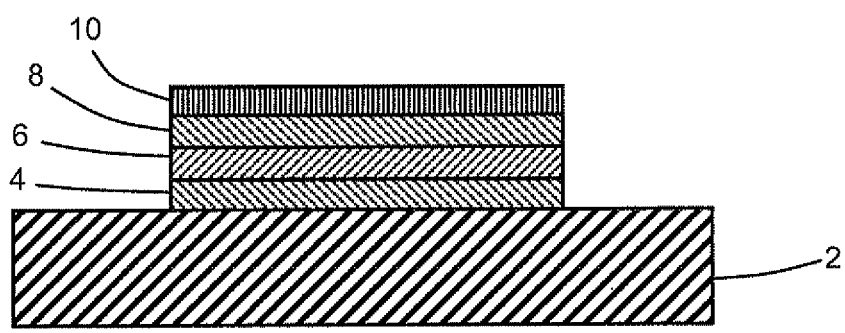

FIG. 3 represents the etching step of layers 4, 6 and 8 through mask 10, for example by anisotropic plasma etching. The stack is thereby delineated laterally, which enables an electric contact to be subsequently made in the etched area.

Figure 4:
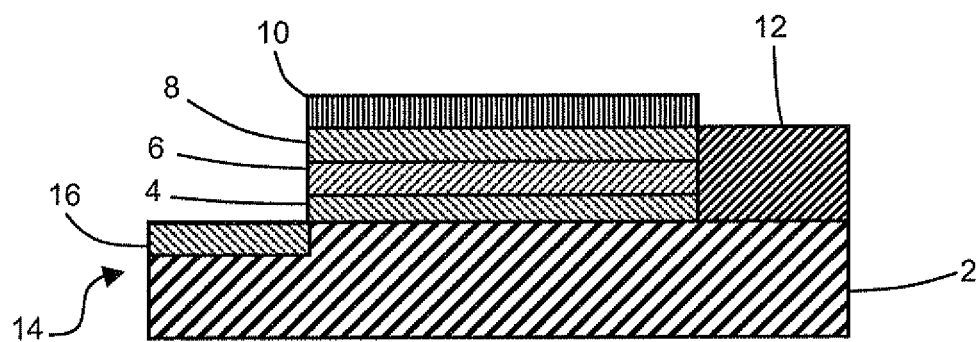

The step of FIG. 4 corresponds to formation of a unilateral electric contact pad 12 on substrate 2, in contact with layer 6. Contact 12 thus enables the holes to be transported from substrate 2 to the silicon/electrolyte interface, on the left, passing via layer 6. Contact 12 preferably extends over the whole thickness of layers 4, 6 and 8. Contact 12 can be formed by deposition of a metal, of a silicide or of a P-doped or strongly N-doped semiconductor material, preferably formed by epitaxy.

An area 14 of substrate 2, on the left of FIG. 4, remains exposed. This area is therefore liable to be rendered porous if substrate 2 is P-doped. In this case, an N-doped well 16 (concentration less than $10^{18}$ atoms/cm$^3$) can be formed in area 14 to prevent the dissolution reaction. In other words, area 14 is rendered resistant to anodization.

It can also be envisaged to deposit a protective layer on area 14 of the substrate, preferably an electrically insulating layer resistant to HF, or not to etch layer 4 in this area, in the step of FIG. 3.

Figure 5:
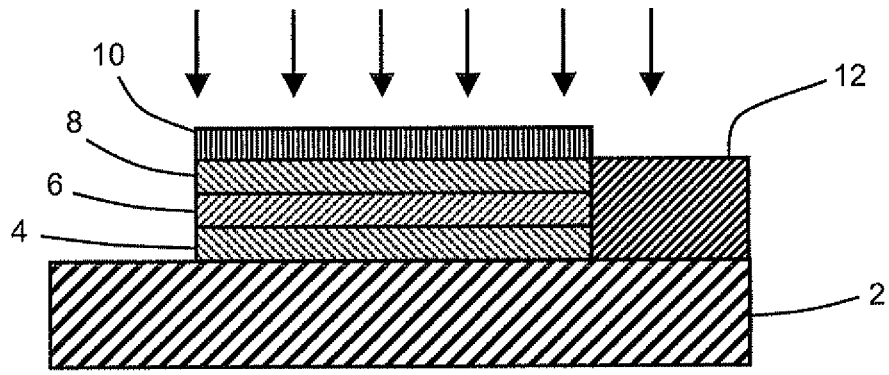
FIG. 5 represents an alternative embodiment of the step of FIG. 4 for forming a lateral electric contact pad.

FIG. 5 represents an alternative embodiment of the formation step of contact pad 12. Instead of depositing a material (FIG. 4), contact 12 can be formed by ion implantation through mask 10. The implanted dopants are then N-type with a concentration greater than or equal to $10^{18}$ atoms/cm$^3$ or P-type.

Figure 6:
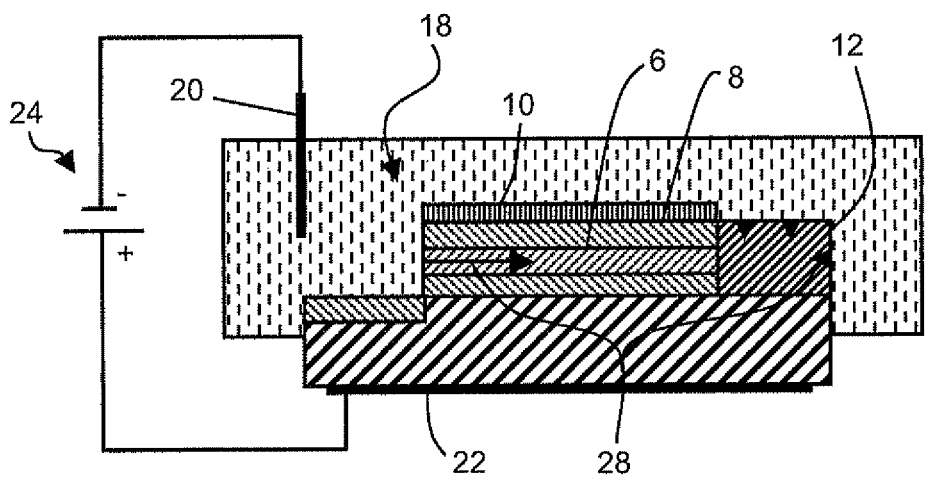
FIGS. 6 to 8 represent a second series of steps of the first embodiment.
Figure 7:
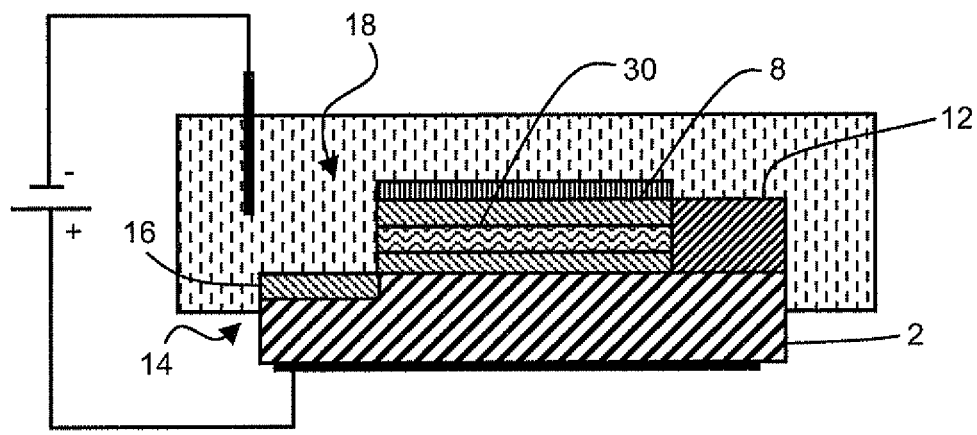
Figure 8:
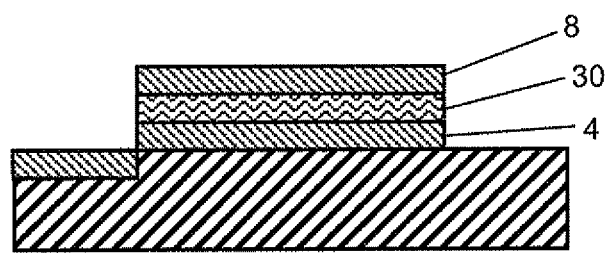

FIGS. 6 to 8 represent a second series of steps of the formation method, after the required stack of layers and contact 12 have been defined.

The step of FIG. 6 corresponds to electrochemical treatment by anodic dissolution of silicon layer 6, of P-type or strongly doped N-type. The front face of substrate 2, on the stack side, is immersed in a hydrofluoric acid-based electrolyte 18. An electrode 20 is plunged into electrolyte 18 and an electrode 22 is arranged so as to bias substrate 2, for example on the rear face of the substrate. Electrodes 20 and 22 are connected to a voltage generator 24. This treatment is performed in the dark.

Electrodes 20 and 22 impose a global electric field. The distribution of the electric field in the structure is such that displacement of the holes is privileged in the P-type layers (or possibly the strongly doped N-type layers). Displacement of the holes therefore takes place preferably in substrate 2, contact 12 and layer 6.

The silicon/electrolyte interface, also called etching front, moves progressively in layer 6 and possibly in contact pad 12 as the reaction takes place, as illustrated by arrows 28. When contact 12 is made from P-doped or strongly N-doped semiconductor, it is also chemically etched by electrolyte 18. The same is true for a metal that is not inert to HF. Contact pad 12 is preferably formed from a metal resistant to anodization chosen from Au, Pt or Ag. The etching front then progresses in a single direction, in the plane of layer 6.

Although layer 8 is resistant to anodization, it is preferable to cover layer 8 with a material resistant to electrolyte 18. The risk of damage to the top face of layer 8, for example an increased surface roughness, is thereby eliminated. In this perspective, etching mask 10 used for delineating the stack and/or for formation of lateral contact 12 should preferably be kept.

FIG. 7 represents the structure obtained at the end of the anodization step. Bulk silicon layer 6 is transformed into a porous silicon layer 30. Silicon 30 is preferably microporous or mesoporous.

In area 14, the surface of substrate 2 in contact with electrolyte 18 remains intact when it is protected by a hole blocking layer, for example N-type well 16.

FIG. 8 represents an example of a multilayer structure obtained by the method: a bulk silicon layer 8 arranged above a porous silicon layer 30. Contact 12 can be eliminated, for example by dry etching with a chlorinated chemistry or by wet etching with an iodized chemistry, through mask 10. Mask 10 can also be removed.

In the case where layers 6 and 8 of the stack are formed by epitaxy from layer 4, for example made from N-doped silicon, the crystalline orientation of these bulk layers is preserved. The lattice parameter is in fact almost identical between a P-type doping (layer 6) and an N-type doping (layers 4, 8). Constraints on the thickness of layer 30 to be sacrificed are thereby avoided.

Figure 9:
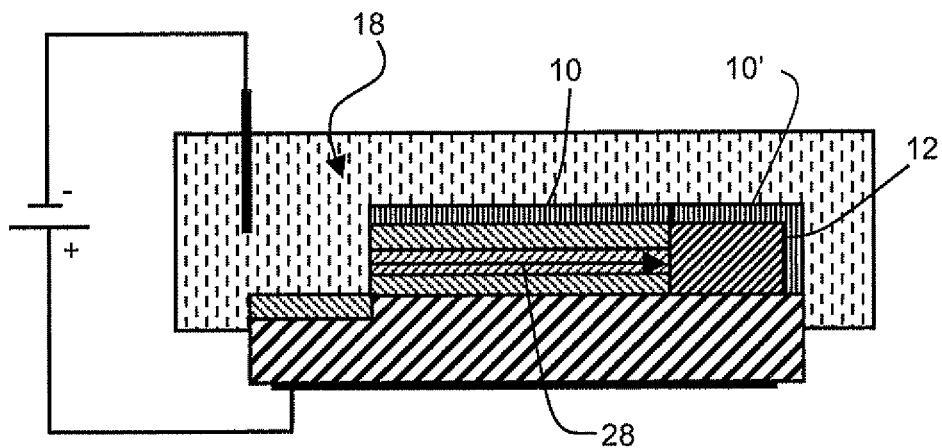
FIG. 9 represents an alternative embodiment of the anodization step of FIG. 6, FIGS. 10 and 11 represent steps of a second embodiment of a method for forming a multilayer structure according to the invention.

FIG. 9 represents an alternative embodiment wherein lateral contact 12 is covered by a protective layer 10' made from an electrically insulating material that is resistant to electrolyte 18. On the one hand, contact 12 is thereby protected against anodization, and on the other hand, the displacement path of the holes is modified. The etching front 28 only moves through layer 6. The material of layer 10' is preferably identical to the material of etching mask 10, for example silicon nitride.

In the case of a contact 12 resistant to anodization, for example made from Au, Pt or Ag, or when the contact is covered by layer 10', layer 6 is rendered porous whatever its length.

Figure 10:
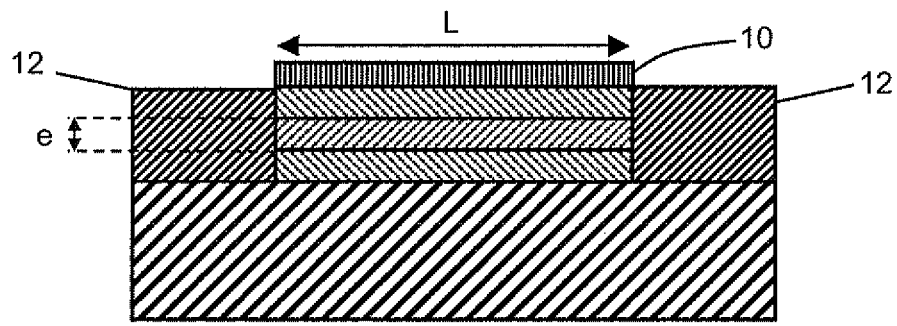
Figure 11:
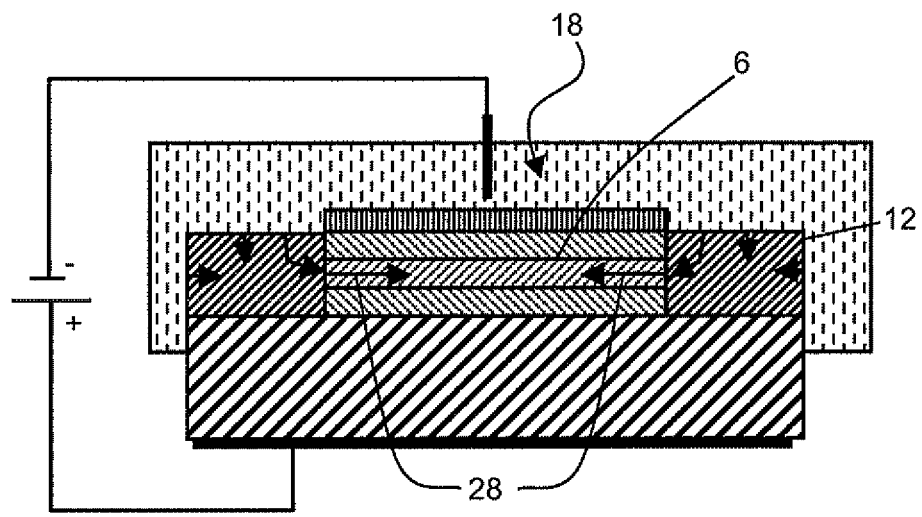

FIGS. 10 and 11 represent steps of a second implementation of a method for forming a multilayer structure.

In FIG. 10, electric contact 12 is formed on each side of the stack, i.e. on opposite lateral faces. In this case, the material forming contact 12 is a material reactive to anodization, for example a P-doped or strongly N-doped semiconductor. Bilateral contact 12 can be formed in the same way as the unilateral contact, as described in relation with FIGS. 3 to 5.

Contact 12 can thus be present on one or more lateral faces of the stack so long as layer 6 can come into contact with electrolyte. In certain cases, the contact can be arranged at the periphery of the stack.

FIG. 11 represent the following step of anodization. The principle of implementation is similar to that described in the foregoing in relation with FIG. 6. In this configuration, etching front 28 progresses on both sides of the stack through contact 12. A top portion of contact 12 is firstly dissolved and etching front 28 then reaches the two ends of layer 6 and progresses in the plane of layer 6.

In this embodiment, the length of layer 6, noted L in FIG. 10, is a function of the thickness e of layer 6. The maximum length that can be etched is equal to about twice the thickness e (L=2.e). Beyond this maximum length, the etching front does not reach the center of layer 6. As the portion of contact 12 at each end of layer 6 has become porous, it can no longer conduct the holes. A central part of layer 6 will therefore not be converted into porous silicon. However, in this bilateral approach, the etched distance for a given time is doubled.

This embodiment therefore enables the length of the etched layer to be fixed according to the thickness of layer 6, regardless of the etching time.

Figure 12:
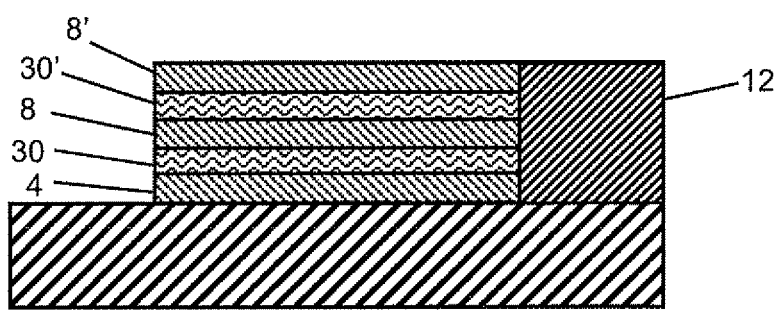
FIG. 12 represents an example of a structure comprising an alternation of layers obtained by the method according to the invention.

FIG. 12 represents another example of a multilayer structure comprising an alternation of several porous silicon layers (30, 30') with several bulk silicon layers (8, 8'), i.e. several porous Si/Si periods. This structure is obtained by means of the method described above using a lateral contact 12 which extends over the whole height of the stack. Several layers of one and the same stack can thus be rendered porous simultaneously. The epitaxied bulk silicon layers have the same crystalline structure.

The porous silicon of layer 30 (and of layer 30' in the case of FIG. 12) can be kept or sacrificed according to the requirements of the desired application.

Porous silicon can be oxidized selectively with respect to bulk silicon. Porous silicon with pores of several nanometers or tens of nanometers (microporous or mesoporous) does in fact present a large surface and inter-pore walls with a thickness of only a few nanometers. Thermal oxidation of the porous silicon is therefore faster than thermal oxidation of bulk silicon. For example, silicon nanowires electrically insulated from each other by the oxidized porous silicon can be obtained. By oxidizing the porous silicon, the constraints related to etching of the sacrificial material and to filling with an oxide can be avoided.

The porous silicon oxide can also be etched selectively with respect to the bulk silicon by dry etching or by hydrofluoric acid-based wet etching, for example to locally make a SON (Silicon On Nothing) structure. The bulk silicon layer can also be strained (SSON: Strained Silicon On Nothing) by adjusting the thickness of the porous silicon layer and the oxidation time.

It is also possible to eliminate the porous silicon without having recourse to thermal oxidation, for example by wet etching with a TMAH solution at ambient temperature.

In the case of porous silicon or of its oxide, the etching rate and selectivity are increased significantly with respect to silicon-germanium. In particular, in the case of mesoporous or microporous silicon, the selectivity and etching rate are increased by at least one order of magnitude. These materials are therefore particularly interesting to be used as sacrificial materials, for example for fabrication of cantilevers in Micro-Electro-Mechanical Systems (MEMS).

Finally, another solution consists in choosing electropolishing (or electroerosion) conditions when performing anodization, by applying a strong current for example. The silicon reactive to anodization is then etched directly.

Numerous variants and modifications of the method described here will be apparent to the person skilled in the art. The method has been described in relation with a silicon multilayer structure. The use of other semiconductor materials, in particular a silicon-germanium alloy with a germanium concentration of less than 30%, is not excluded. This alloy presents similar properties to those of pure silicon and can be subjected to anodization. Furthermore, the method is not limited to planar layers. It can also be applied to layers of various shapes. In all cases, it is possible to direct the electric field seen by the holes by adjusting the stack of hole-conducting and non-hole-conducting layers.

The invention claimed is:

1. A method for forming a multilayer structure on a substrate, comprising the following steps:
   providing a stack successively comprising a hole blocking layer, reactive to anodic treatment made from N-doped semiconductor material having a dopant concentration greater than or equal to $10^{18}$ atoms/cm$^3$ or P-doped semiconductor material, and a second layer made from semiconductor resistant to anodic treatment,
   making a lateral electric contact pad between the first layer and the substrate, and
   stack to said anodic treatment in an electrolyte.

2. The method according to claim 1, wherein the anodic treatment is made under conditions such that the material of the first layer is transformed into porous material.

3. The method according to claim 1, wherein the anodic treatment is made under conditions such that the material of the first layer is completely etched.

4. The method according to claim 1, wherein the hole blocking layer and the second layer are formed from materials of the same nature.

5. The method according to claim 4, wherein the hole blocking layer and the second layer are formed from N-doped semiconductor material having a dopant concentration less than $10^{18}$ atoms/cm$^3$.

6. The method according to claim 1, comprising forming a first protective layer made from a material resistant to the electrolyte on the second layer of semiconductor material.

7. The method according to claim 6, comprising forming a second protective layer made from an electrically insulating material resistant to the electrolyte on the lateral electric contact pad.

8. The method according to claim 1, wherein the lateral electric contact pad is formed by ion implantation of N-type with a dopant concentration greater than or equal to $10^{18}$ atoms/cm$^3$ or of P-type through a mask.

9. The method according to claim 1, wherein the stack is laterally delineated by etching of the hole blocking layer and of the first and second layers through a mask.

10. The method according to claim 9, wherein the lateral electric contact pad is formed by epitaxy of an N-doped semiconductor material with a dopant concentration greater than or equal to $10^{18}$ atoms/cm$^3$ or P-type semiconductor material.

11. The method according to claim 9, wherein the lateral electric contact pad is made by deposition of a metal layer.

12. The method according to claim 1, wherein the lateral electric contact pad is arranged on both sides of the stack and is made from an N-doped semiconductor material with a dopant concentration greater than or equal to $10^{18}$ atoms/cm$^3$ or P-type semiconductor material.

13. The method according to claim 1, wherein the stack comprises more than one repetition of first and second layers made from semiconductor materials.

\* \* \* \* \*